(12) United States Patent
Lee et al.

(10) Patent No.: US 11,901,115 B2
(45) Date of Patent: Feb. 13, 2024

(54) SUBSTRATE ASSEMBLY WITH ENCAPSULATED MAGNETIC FEATURE

(71) Applicant: Intel Corporation, Santa Clara, CA (US)

(72) Inventors: Kyu-Oh Lee, Chandler, AZ (US); Rahul Jain, Gilbert, AZ (US); Sai Vadlamani, Chandler, AZ (US); Cheng Xu, Chandler, AZ (US); Ji Yong Park, Chandler, AZ (US); Junnan Zhao, Gilbert, AZ (US); Seo Young Kim, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/873,509

(22) Filed: Jul. 26, 2022

(65) Prior Publication Data

US 2022/0359115 A1  Nov. 10, 2022

Related U.S. Application Data

(62) Division of application No. 16/020,035, filed on Jun. 27, 2018, now Pat. No. 11,443,892.

(51) Int. Cl.
| | |
|---|---|
| H01F 27/32 | (2006.01) |
| H01L 23/498 | (2006.01) |
| H01F 41/04 | (2006.01) |
| H01L 21/48 | (2006.01) |
| H01F 27/28 | (2006.01) |
| H01L 21/683 | (2006.01) |
| H01L 23/00 | (2006.01) |

(52) U.S. Cl.
CPC ....... *H01F 27/327* (2013.01); *H01F 27/2804* (2013.01); *H01F 41/043* (2013.01); *H01L 21/486* (2013.01); *H01L 21/4857* (2013.01); *H01L 21/4867* (2013.01); *H01L 23/49822* (2013.01); *H01L 23/49838* (2013.01); *H01F 2027/2809* (2013.01); *H01L 21/6835* (2013.01); *H01L 24/16* (2013.01); *H01L 2221/68345* (2013.01); *H01L 2221/68359* (2013.01); *H01L 2224/16227* (2013.01); *H01L 2224/16267* (2013.01); *H01L 2924/19042* (2013.01); *H01L 2924/19102* (2013.01)

(58) Field of Classification Search
None
See application file for complete search history.

(56) References Cited

U.S. PATENT DOCUMENTS

| | | | |
|---|---|---|---|
| 10,122,089 B2 * | 11/2018 | Nair | ..................... H01Q 1/2291 |
| 2010/0026443 A1 | 2/2010 | Yan | |
| 2011/0050334 A1 | 3/2011 | Pan | |
| 2011/0291785 A1 | 12/2011 | Lim | |

(Continued)

*Primary Examiner* — Long Pham
(74) *Attorney, Agent, or Firm* — Schwabe, Williamson & Wyatt, P.C.

(57) ABSTRACT

Apparatuses, systems and methods associated with a substrate assembly with an encapsulated magnetic feature for an inductor are disclosed herein. In embodiments, a substrate assembly may include a base substrate, a magnetic feature encapsulated within the base substrate, and a coil, wherein a portion of the coil extends through the magnetic feature. Other embodiments may be described and/or claimed.

20 Claims, 16 Drawing Sheets

(56) References Cited

U.S. PATENT DOCUMENTS

| | | | |
|---|---|---|---|
| 2012/0086113 A1* | 4/2012 | Smith | H05K 1/189 |
| | | | 257/E23.116 |
| 2013/0175664 A1 | 7/2013 | De Rochemont | |
| 2014/0293529 A1* | 10/2014 | Nair | H01Q 7/06 |
| | | | 257/690 |
| 2016/0206814 A1 | 7/2016 | Ring et al. | |
| 2021/0273036 A1* | 9/2021 | Marin | H05K 1/181 |

* cited by examiner

SUBSTRATE ASSEMBLY WITH ENCAPSULATED MAGNETIC FEATURE

CROSS-REFERENCE TO RELATED APPLICATIONS

This application is a division of U.S. patent application Ser. No. 16/020,035, filed on Jun. 27, 2018, the entire contents of which is hereby incorporated by reference herein.

TECHNICAL FIELD

The present disclosure relates to the field of electronic circuits. More particularly, the present disclosure relates to a substrate assembly with an encapsulated magnetic feature for an inductor.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

As server architectures have evolved, it is expected that power delivery requirements of substrate assemblies will increase. The efficiency of inductors utilized for power delivery may play a role in meeting the higher requirements. Some legacy approaches to inductors within the substrate assemblies include inductors with air cores. However, inductors with air cores may not meet the higher efficiency requirements.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
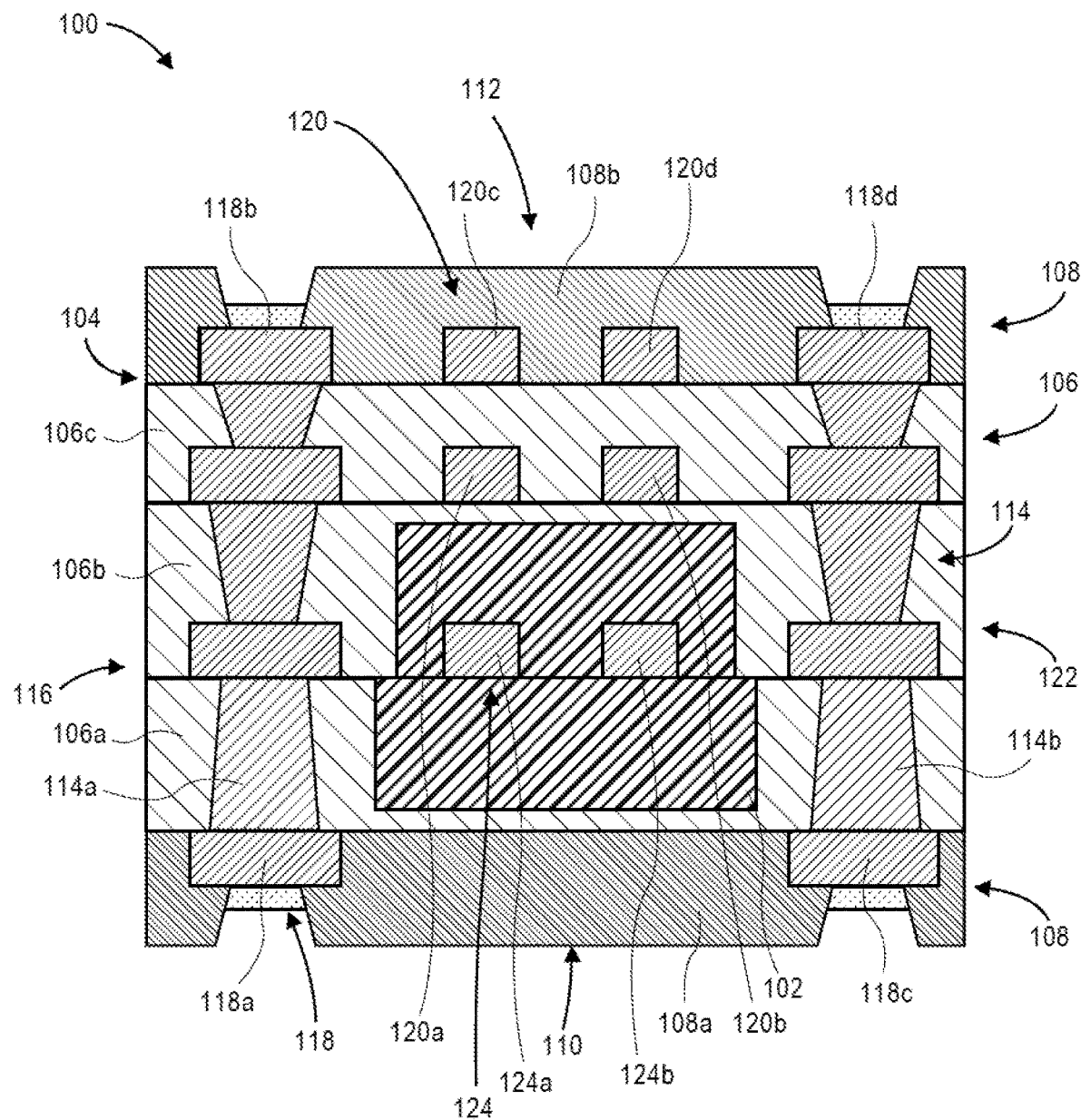
FIG. 1 illustrates a cross-sectional view an example substrate assembly with an encapsulated magnetic feature, according to various embodiments.

Apparatuses, systems and methods associated with a substrate assembly with an encapsulated magnetic feature for an inductor are disclosed herein. In embodiments, a substrate assembly may include a base substrate, a magnetic feature encapsulated within the base substrate, and a coil, wherein a portion of the coil extends through the magnetic feature.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 illustrates a cross-sectional view an example substrate assembly 100 with an encapsulated magnetic feature 102, according to various embodiments. The substrate assembly 100 may include a base substrate 104. The base substrate 104 may include one or more dielectric regions 106. In the illustrated embodiment, the base substrate 104 includes a first dielectric region 106a, a second dielectric region 106b, and a third dielectric region 106c. It is to be understood that in other embodiments, the base substrate 104 may include more or less than three dielectric regions 106 in other embodiments. Each of the dielectric regions 106 may comprise a dielectric layer, where each dielectric layer is formed at a different time from the other dielectric layers. The dielectric regions 106 may comprise a dielectric material. In some embodiments, each of the dielectric regions 106 may comprise one or more build-up films, where the build-up films may include dielectric material and may be epoxy-based.

The base substrate 104 may further include one or more surface finish regions 108. The surface finish regions 108 may be located at one or more sides of the base substrate 104. The surface finish regions 108 may include one or more surface finish layers located at the sides of the base substrate 104. In the illustrated embodiment, the base substrate 104 includes a first surface finish region 108a located at a first side 110 of the base substrate 104 and a second surface finish region 108b at a second side 112 of the base substrate 104, where the second side 112 is opposite to the first side 110.

The surface finish regions 108 may protect the base substrate 104 from damage. In some embodiments, the surface finish regions 108 may comprise electroless nickel immersion gold (ENIG), electrolytic nickel-gold, solder on pad (SOP), immersion gold, immersion silver, organic solder preserve (OSP), or some combination thereof.

The base substrate 104 may further include one or more pads 118. The pads 118 may be located at one or more surfaces of the base substrate 104. Further, the pads 118 may allow for electrical coupling of conductive elements of the base substrate 104 with other electrical components, such as printed circuit boards (PCBs), semiconductor devices (such as processors, memory devices, and power devices), or some combination thereof. In the illustrated embodiment, the base substrate 104 includes a first pad 118a and a third pad 118c located at the first side 110 of the base substrate 104, and a second pad 118b and a fourth pad 118d located at the second side 112 of the base substrate 104.

The base substrate 104 may further include one or more conductive paths 114. The conductive paths may include one or more conductive elements (such as vias, traces, and/or conductive layers) that can conduct electricity. For example, the conductive elements may include conductive material, such as copper, silver, gold, aluminum, zinc, nickel, tin, or some combination thereof. In the illustrated embodiment, the base substrate 104 includes a first conductive path 114a and a second conductive path 114b.

The first conductive path 114a may be located toward a third side 116 of the base substrate 104. The first conductive path 114a may extend through the dielectric regions 106 and the surface finish regions 108. Further, the first conductive path 114a may electrically couple the first pad 118a located at the first side 110 of the base substrate 104 with the second pad 118b located at a second side 112 of the base substrate 104.

The second conductive path 114b may be located toward a fourth side 122 of the base substrate 104. The second conductive path 114b may extend through the dielectric regions 106 and the surface finish regions 108. Further, the second conductive path 114b may electrically couple the third pad 118c located at the first side 110 of the base substrate 104 with the fourth pad 118d located at the second side 112 of the base substrate 104.

The base substrate 104 may further include one or more conductive elements 120 interspersed within the dielectric regions 106 and/or the surface finish regions 108. The conductive elements 120 may include vias, traces, conductive layers, other electrically conductive structures, or some combination thereof. The conductive elements 120 may include conductive material, such as copper, silver, gold, aluminum, zinc, nickel, tin, or some combination thereof. In the illustrated embodiment, the base substrate 104 includes a first conductive element 120a and a second conductive element 120b located within the third dielectric region 106c. Further, the base substrate 104 includes a third conductive element 120c and a fourth conductive element 120d located within the second surface finish region 108b.

The base substrate 104 may further include the magnetic feature 102. The magnetic feature 102 may be located within one or more of the dielectric regions 106 and may be encompassed by the dielectric regions 106. The base substrate 104 may further have portions of at least two regions (such as the dielectric regions 106 and the surface finish regions 108) located between the magnetic feature 102 and one or more sides of the base substrate 104. For example, a portion of the first dielectric region 106a and the first surface finish region 108a are located between the magnetic feature 102 and the first side 110 of the base substrate 104 in the illustrated embodiment. Further, a portion of the second dielectric region 106b, the third dielectric region 106c, and the second surface finish region 108b are located between the magnetic feature 102 and the second side 112 in the illustrated embodiment. The magnetic feature 102 may further be located between two or more of the conductive paths 114. For example, the magnetic feature 102 is located between the first conductive path 114a and the second conductive path 114b in the illustrated embodiment.

The magnetic feature 102 may be formed of a magnetic material. For example, the magnetic feature 102 may comprise a ferromagnetic material in some embodiments. The magnetic feature 102 may have a magnetic permeability selected based on the particular application in which the substrate assembly 100 is being utilized.

The base substrate 104 may further include one or more conductive elements 124 that extend through the magnetic feature 102. For example, the conductive elements 124 may extend through the magnetic feature 102 from a first side of the magnetic feature 102 to a second side of the magnetic feature 102, where the first side of the magnetic feature 102 is opposite to the second side of the magnetic feature 102. The conductive elements 124 may include vias, traces, or some combination thereof. The conductive elements 124 may include conductive material, such as copper, silver, gold, aluminum, zinc, nickel, tin, or some combination thereof. In the illustrated embodiment, the base substrate 104 includes a first conductive element 124a and a second conductive element 124b that extend through the magnetic feature 102. The first conductive element 124a and the second conductive element 124b are both traces in the illustrated embodiment.

The first conductive element 124a and the second conductive element 124b may be electrically coupled to the first conductive element 120a, second conductive element 120b, the third conductive element 120c, the fourth conductive element 120d, the first conductive path 114a, the second conductive path 114b, or some combination thereof. For example, the first conductive element 124a and the second conductive element 124b may be electrically coupled to the first conductive element 120a and the second conductive element 120b in some embodiments. The first conductive element 124a and the second conductive element 124b may be electrically coupled to the first conductive element 120a and the second conductive element 120b by one or more vias, traces, and/or conductive layers. Further, the first conductive element 124a, the second conductive element 124b, the first conductive element 120a, the second conductive element 120b, and any conductive elements that electrically couple them may form a coil. A portion of the magnetic feature 102 may extend within the center of the coil, thereby providing a magnetic core for the coil. Accordingly, the conductive elements and the magnetic feature 102 may form an inductor with a magnetic core. The magnetic core may provide for greater efficiency of the inductor than inductors with air cores and/or without magnetic cores.

In other embodiments, the first conductive element 124a and the second conductive element 124b may be electrically coupled to conductive elements external to the package substrate, where the first conductive element 124a, the second conductive element 124b, and the external conductive elements may form a coil. In these embodiments, the external conductive elements may extend along any of the sides of the base substrate 104, where a portion of the magnetic feature 102 is located between the conductive elements 124 and the external conductive elements.

While the illustrated embodiment illustrates two conductive elements 124 that extend through the magnetic feature 102, it is to be understood that there may be more or fewer conductive elements 124 that extend through the magnetic feature 102 in other embodiments. Further, there may be more or fewer than four conductive elements 120 interspersed within the dielectric regions 106 and the surface finish regions 108 in other embodiments. Additionally, the number of conductive elements 124 and conductive elements 120 electrically coupled to each other may vary in other embodiments.

Figure 2:
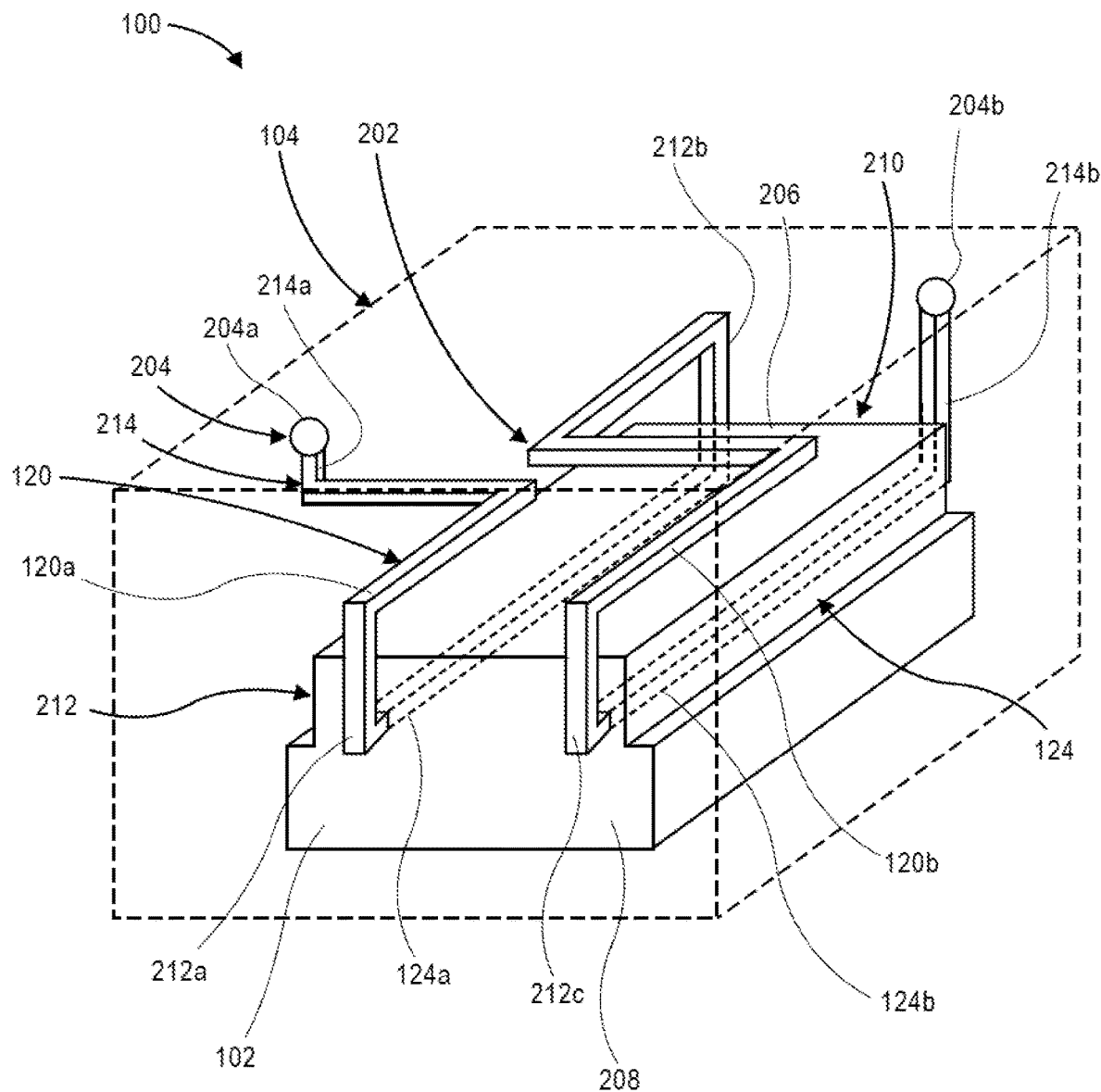
FIG. 2 illustrates a perspective view of a simplified version of the example substrate assembly of FIG. 1, according to various embodiments.

FIG. 2 illustrates a perspective view of a simplified version of the example substrate assembly 100 of FIG. 1, according to various embodiments. In particular, the simplified version shows the magnetic feature 102 and the conductive elements that form a coil 202 for clarity. Other features (such as the conductive paths 114, the pads 118, one or more of the conductive elements 120, and the indications of the separations between the regions) are omitted from being illustrated in FIG. 2 to provide a clear view of the magnetic feature 102 and the conductive elements that form the coil 202, although it is to be understood that the substrate assembly 100 includes the omitted features.

The base substrate includes the magnetic feature 102 and a coil 202. A portion of the coil 202 may extend through the magnetic feature 102. Further, the coil 202 may be coupled to one or more pads 204. The pads 204 may include one or more features of the pads 118 (FIG. 1).

The coil 202 may include the first conductive element 120a and the second conductive element 120b. The first conductive element 120a and the second conductive element 120b may comprise traces in the illustrated embodiment. The first conductive element 120a and the second conductive element 120b may extend along one or more sides of the magnetic feature 102. For example, the first conductive element 120a and the second conductive element 120b may extend along a first side 206 of the magnetic feature 102. Further, the first conductive element 120a and the second conductive element 120b may be separated from the magnetic feature 102 by dielectric material (such as a portion of one or more of the dielectric regions 106 (FIG. 1)). The first conductive element 120a and the second conductive element 120b may further extend past a first end 208 and a second end 210 of the magnetic feature 102.

The coil 202 may further include the first conductive element 124a and the second conductive element 124b. The first conductive element 124a and the second conductive element 124b may extend through the magnetic feature 102. In particular, the first conductive element 124a and the second conductive element 124b may extend from the first end 208 of the magnetic feature 102 to the second end 210 of the magnetic feature 102 in the illustrated embodiment. Further, portions of the first conductive element 124a and the second conductive element 124b may extend out of the magnetic feature 102 from the first end 208 and the second end 210 into the dielectric material that encompasses the magnetic feature 102 in the illustrated embodiment.

The coil 202 may further include one or more vias 212 (and/or other conductive elements) that electrically couple the conductive elements 120 and the conductive elements 124. The vias 212 may extend through one or more of the dielectric regions 106 and/or the surface finish regions 108. For example, the coil 202 includes a first via 212a, a second via 212b, and a third via 212c in the illustrated embodiment. The first via 212a and the third via 212c may extend along the first end 208 of the magnetic feature 102, and the second via 212b may extend along the second end 210 in the illustrated embodiment. The first via 212*a* may electrically couple the first conductive element 120*a* and the first conductive element 124*a*. The second via 212*b* may couple the first conductive element 124*a* and the second conductive element 120*b*. The third via 212*c* may couple the second conductive element 120*b* and the second conductive element 124*b*.

The base substrate 104 may further include one or more vias 214 (and/or other conductive elements) that electrically couple the coil 202 to the pads 204. For example, the base substrate 104 may include a first via 214*a* and a second via 214*b* in the illustrated embodiment. The first via 214*a* may couple the first conductive element 120*a* with a first pad 204*a*. The second via 214*b* may couple the second conductive element 124*b* with a second pad 204*b*.

While the illustrated embodiment shows the coil 202 having approximately one and a half windings, it is to be understood that the coil 202 may have one or more windings. In particular, the coil 202 may include more or fewer of the conductive elements 120, the conductive elements 124, and the vias 212 in other embodiments to produce more or fewer windings of the coil 202.

Figure 3:
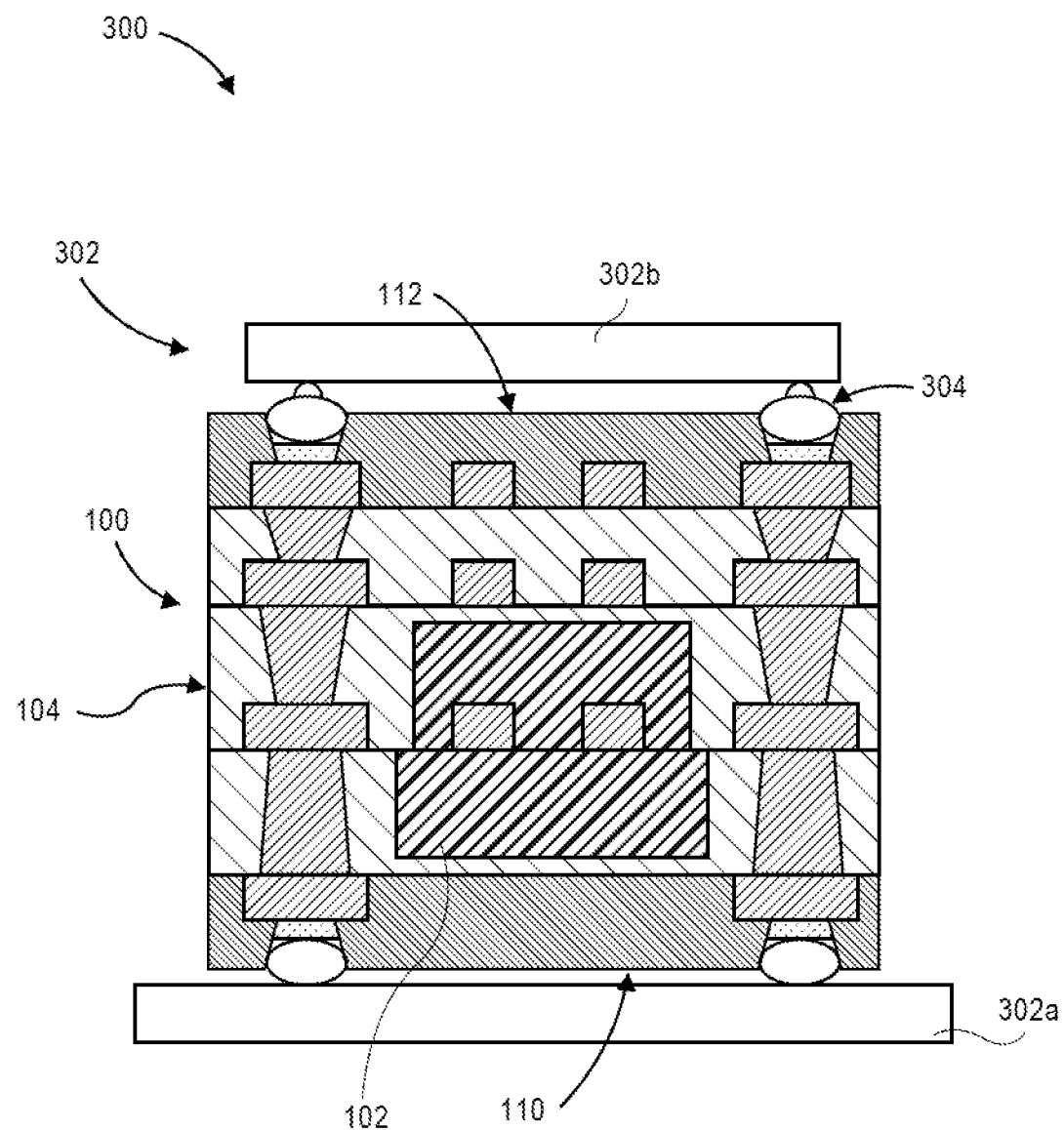
FIG. 3 illustrates a cross-sectional view of a portion of an example computer device with the substrate assembly of FIG. 1, according to various embodiments.
Figure 25:
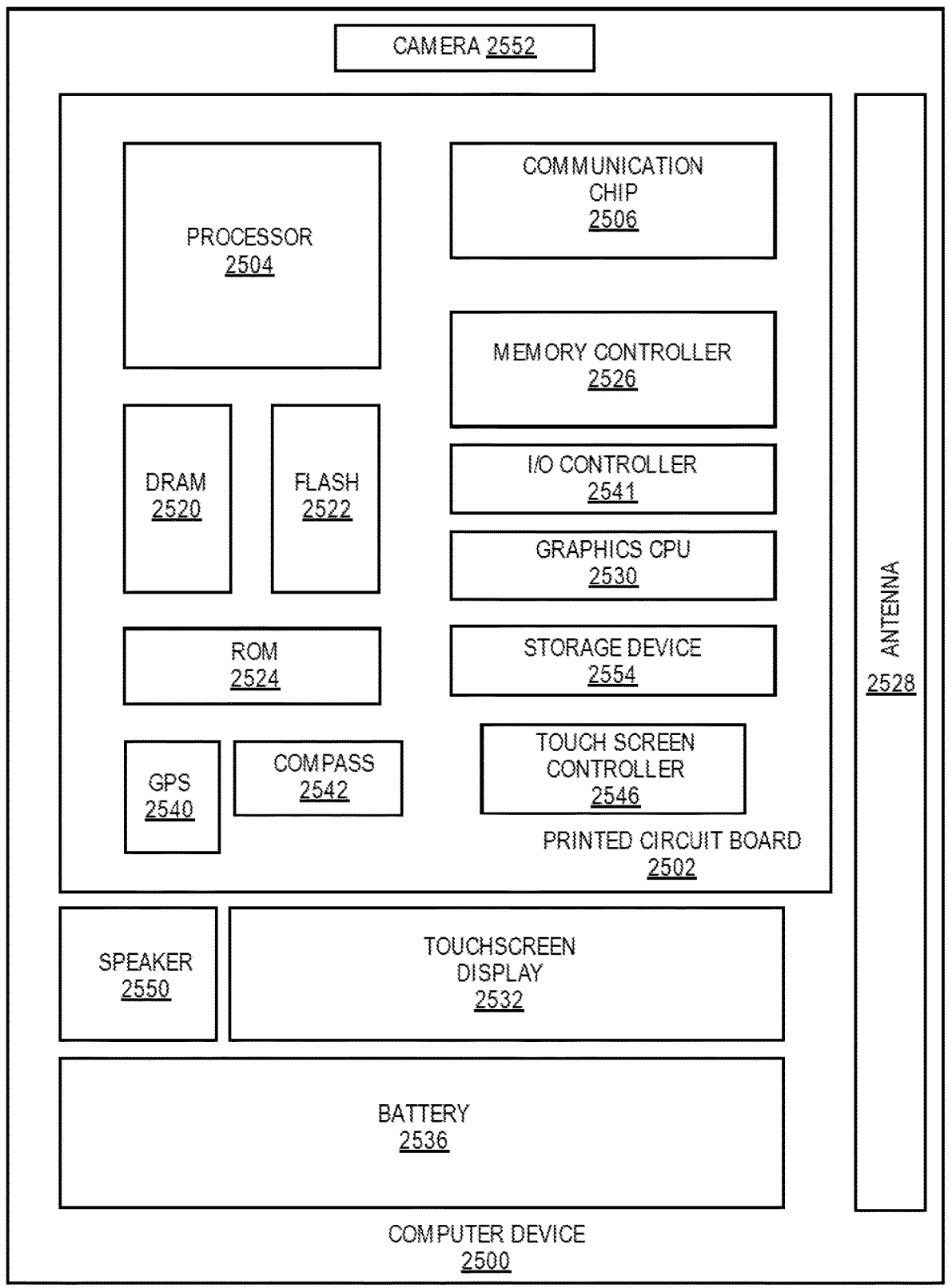
FIG. 25 illustrates an example computer device that may employ the apparatuses and/or methods described herein, in accordance with various embodiments.

FIG. 3 illustrates a cross-sectional view of a portion 300 of an example computer device with the substrate assembly 100 of FIG. 1, according to various embodiments. In particular, portion 300 of the computer device illustrated may be a portion of the computer device 2500 (FIG. 25).

The substrate assembly 100 may have electrical components 302 coupled to one or more of the pads 118 (FIG. 1). For example, a first electrical component 302*a* is coupled to the first side 110 of the base substrate 104 and a second electrical component 302*b* is coupled to the second side 112 of the base substrate 104 in the illustrated embodiment. The electrical components 302 may be coupled to the pads 118 via interconnect structures (such as solder balls 304 in the illustrated embodiment).

The first electrical component 302*a* may comprise a PCB. Further, the second electrical component 302*b* may comprise a semiconductor device (such as a processor, a memory device, and/or a power deliver device). The interconnect structures may electrically couple the coil 202 (FIG. 2) with the first electrical component 302*a*, the second electrical component 302*b*, or some combination thereof. Accordingly, the coil 202 with the magnetic feature 102 may operate as an inductor with a magnetic core for the first electrical component 302*a*, the second electrical component 302*b*, or some combination thereof.

Figure 4:
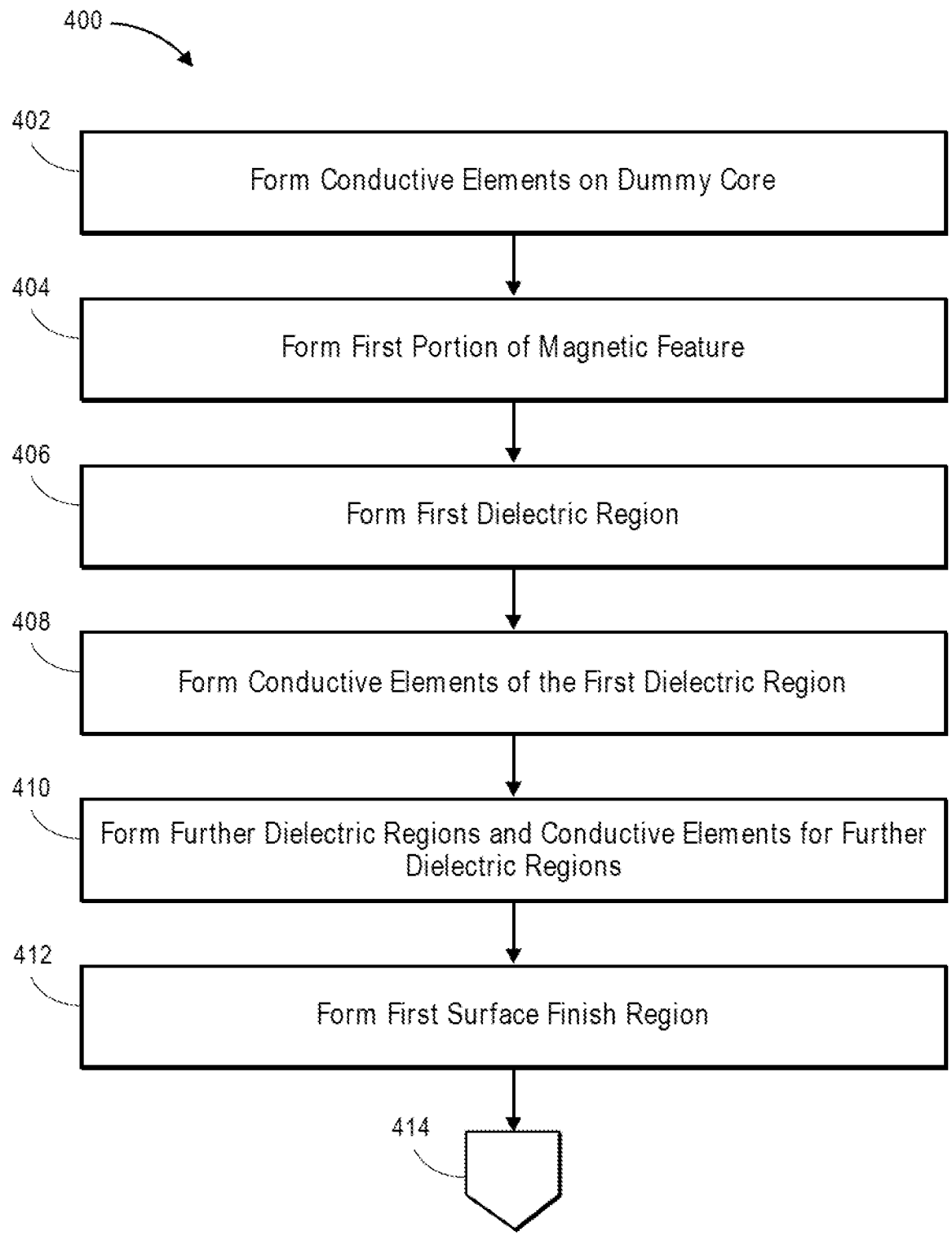
FIG. 4 illustrates a first portion of an example procedure of producing a substrate assembly with a magnetic feature, according to various embodiments.

FIG. 4 illustrates a first portion of an example procedure 400 of producing a substrate assembly with a magnetic feature, according to various embodiments. For example, the procedure 400 may be utilized to produce the substrate assembly 100 (FIG. 1).

Figure 6:
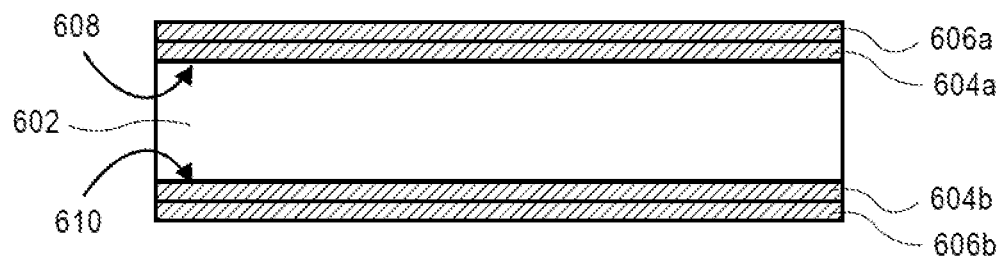
FIG. 6 illustrates an example dummy core, according to various embodiments.

The procedure 400 may start with a dummy core. In particular, FIG. 6 illustrates an example dummy core 602, according to various embodiments, which may be utilized in the procedure 400. The dummy core 602 may have sacrificial layers and dummy copper layers on sides of the dummy core 602. In particular, the dummy core 602 may have a first sacrificial layer 604*a* and a first dummy copper layer 606*a* on a first side 608 of the dummy core 602, and a second sacrificial layer 604*b* and a second dummy copper layer 606*b* on a second side 610 of the dummy core 602. Substrate assemblies may be formed on both the first side 608 and the second side 610 of the dummy core 602 via the procedure 400. However, the description of the procedure 400 provided describes only the formation of the substrate assembly on the first side 608 of the dummy core 602 for brevity. It is to be understood that the procedure 400 may be applied to the second side 610 of the dummy core 602 to produce a second substrate assembly on the second side 610 of the dummy core 602.

Figure 7:
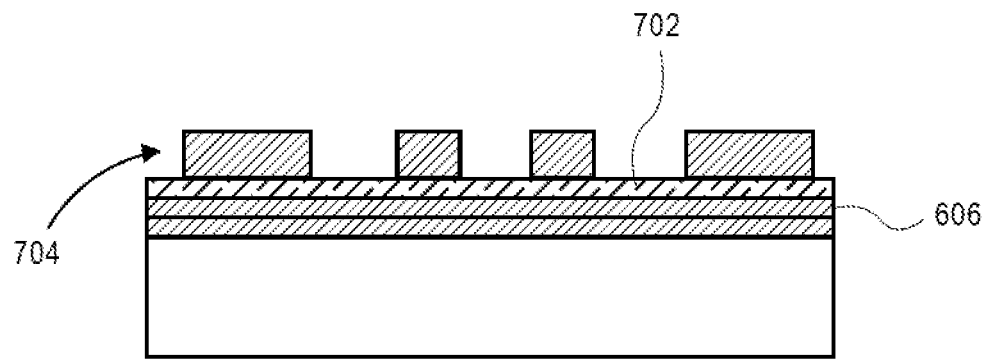
FIG. 7 illustrates a cross-sectional view of an example resultant base substrate in accordance with stage 402, according to various embodiments.

In stage 402, conductive elements may be formed on the dummy core 602. FIG. 7 illustrates a cross-sectional view of an example resultant base substrate in accordance with stage 402, according to various embodiments. Forming the conductive elements may include depositing nickel plating 702 on a surface of the first dummy copper layer 606*a*. A surface of the nickel plating 702 opposite to the first dummy copper layer 606*a* may be roughened.

A photoresist material may be applied to the roughened surface of the nickel plating 702. In some embodiments, the photoresist material may comprise a dry film photoresist material. The photoresist material may be exposed and a portion of the photoresist (either the cured or uncured portion depending on whether the photoresist material is positive photoresist material or negative photoresist material) may be removed, exposing a portion of the nickel plating 702, thereby producing a photoresist pattern.

The conductive elements 704 may be formed on the exposed portion of the nickel plating 702. For example, the conductive elements 704 may be formed through a plating process. The conductive elements 704 may be formed of a conductive material, such as copper, silver, gold, aluminum, zinc, nickel, tin, or some combination thereof. The conductive elements 704 may include one or more traces, pads, or some combination thereof. The remaining photoresist may be removed via a photoresist stripping process.

Figure 8:
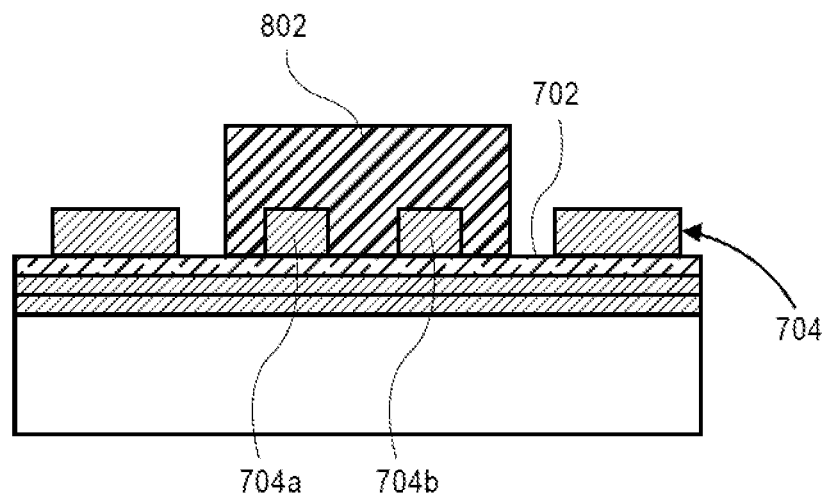
FIG. 8 illustrates a cross-sectional view of an example resultant base substrate in accordance with stage 404, according to various embodiments.

In stage 404, a first portion 802 of a magnetic feature (such as the magnetic feature 102 (FIG. 1)) may be formed on the nickel plating 702. FIG. 8 illustrates a cross-sectional view of an example resultant base substrate in accordance with stage 404, according to various embodiments. Forming the first portion 802 of the magnetic feature may include applying a magnetic paste to a surface of the nickel plating 702. The magnetic paste may comprise a ferromagnetic material. The first portion 802 of the magnetic feature may encircle a portion of the conductive elements 704. For example, the first portion 802 of the magnetic feature may encircle a portion of a first conductive element 704*a* and a second conductive element 704*b*, wherein another portion of the first conductive element 704*a* and the second conductive element 704*b* may extend out of the first portion 802 of the magnetic feature. The first conductive element 704*a* and the second conductive element 704*b* may comprise traces. The first portion 802 of the magnetic feature may be cured, such as through the application of heat, chemicals, or some combination thereof to the first portion 802 of the magnetic feature.

Figure 9:
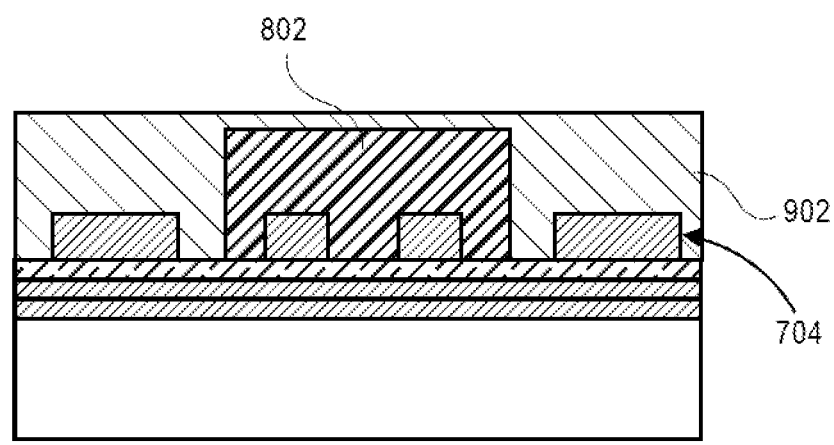
FIG. 9 illustrates a cross-sectional view of an example resultant base substrate in accordance with stage 406, according to various embodiments.

In stage 406, a first dielectric region 902 may be formed on the nickel plating 702. FIG. 9 illustrates a cross-sectional view of an example resultant base substrate in accordance with stage 406, according to various embodiments. The first dielectric region 902 may comprise a first dielectric layer. The first dielectric region 902 may be formed by applying one or more build up films to the nickel plating 702. The first dielectric region 902 may encompass the first portion 802 of the magnetic feature. Further, the first dielectric region 902 may encompass the conductive elements 704, or some portion thereof.

Figure 10:
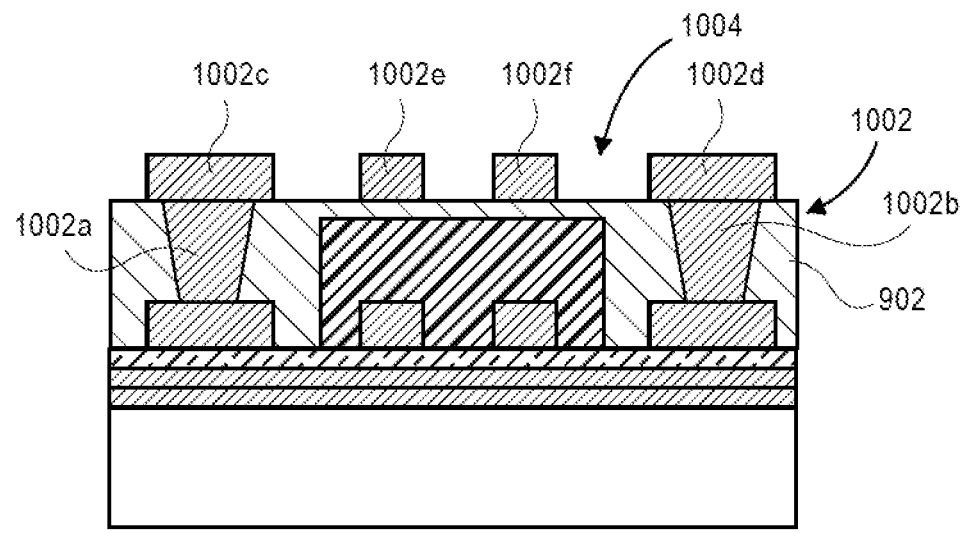
FIG. 10 illustrates a cross-sectional view of an example resultant base substrate in accordance with stage 408, according to various embodiments.

In stage 408, one or more conductive elements 1002 of the first dielectric region may be formed. FIG. 10 illustrates a cross-sectional view of an example resultant base substrate in accordance with stage 408, according to various embodiments. The conductive elements 1002 may be formed within the first dielectric region 902, formed on the first dielectric region 902, or some combination thereof. Forming the conductive elements 1002 may include drilling one or more via recesses (such as through a laser drilling or physical drilling process) in which to form one or more vias.

A photoresist material may be applied to a surface 1004 of the first dielectric region 902. In some embodiments, the photoresist material may comprise a dry film photoresist material. The photoresist material may be exposed and a portion of the photoresist (either the cured or uncured portion depending on whether the photoresist material is positive photoresist material or negative photoresist material) may be removed, exposing a portion of the first dielectric region 902 and/or the via recesses, thereby producing a photoresist pattern.

The conductive elements 1002 may be formed on the first dielectric region 902 and/or within the via recesses. For example, the conductive elements 1002 may be formed through a plating process, which may include forming a seed layer and applying conductive material to the seed layer. The conductive elements 1002 may be formed of a conductive material, such as copper, silver, gold, aluminum, zinc, nickel, tin, or some combination thereof. The conductive elements 1002 may include one or more traces, pads, vias, or some combination thereof. For example, the conductive elements 1002 may include a first via 1002a, a second via 1002b, a first pad 1002c, a second pad 1002d, a first trace 1002e, and a second trace 1002f. The remaining photoresist may be removed via a photoresist stripping process. Further, the exposed seed layer may be removed via a flash etch process. One or more of the surfaces of the conductive elements 1002 may be roughened, such as through a copper roughening process.

Figure 11:
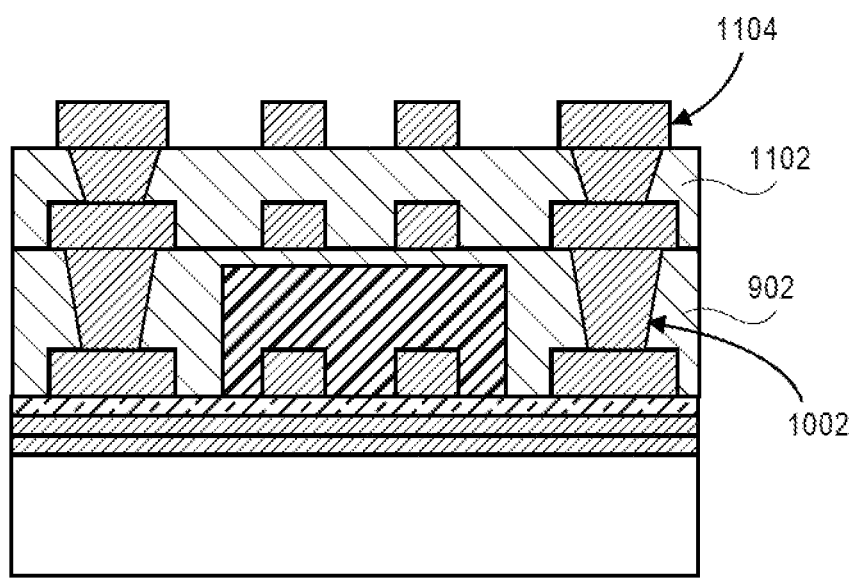
FIG. 11 illustrates a cross-sectional view of an example resultant base substrate in accordance with stage 410, according to various embodiments.

In stage 410, one or more further dielectric regions and/or conductive elements for further dielectric regions may be formed. FIG. 11 illustrates a cross-sectional view of an example resultant base substrate in accordance with stage 410, according to various embodiments. The further dielectric regions and the conductive elements for the further dielectric regions may be formed on the first dielectric region 902. For example, a further dielectric region 1102 and one or more conductive elements 1104 may be formed on the first dielectric region 902. The further dielectric regions may include one or more dielectric layers. The further dielectric regions and the conductive elements may be formed by the same process for forming the first dielectric region 902 and the conductive elements 1002 described in relation to stage 406 and stage 408, respectively. In some embodiments, stage 410 may be omitted.

Figure 12:
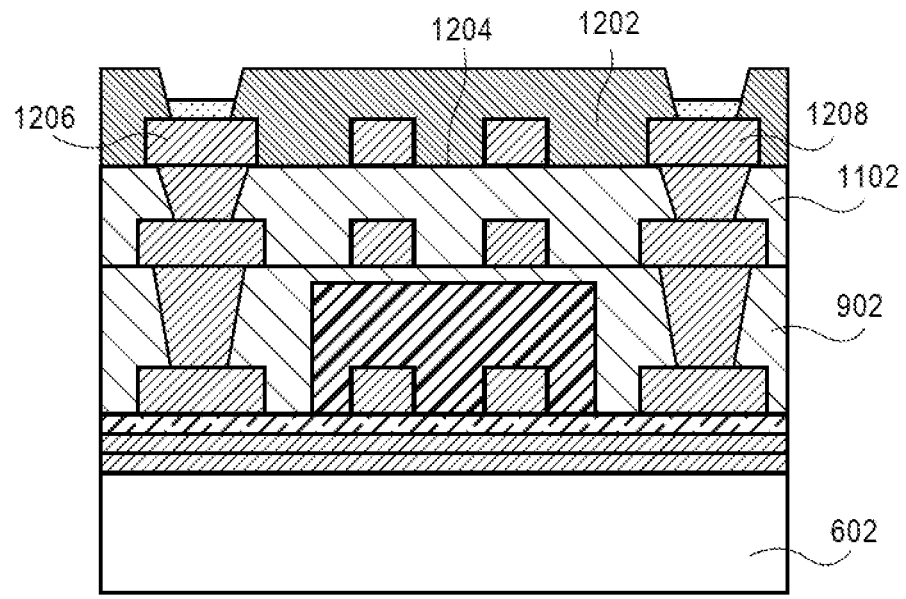
FIG. 12 illustrates a cross-sectional view of an example resultant base substrate in accordance with stage 412, according to various embodiments.

In stage 412, a first surface finish region 1202 may be formed on an exposed dielectric region, which may be the first dielectric region 902 or one of the further dielectric regions. FIG. 12 illustrates a cross-sectional view of an example resultant base substrate in accordance with stage 412, according to various embodiments. The exposed dielectric region may be the dielectric region that is the farthest away from the dummy core 602. Forming the first surface finish region 1202 may include applying the first surface finish region 1202 to a surface of the exposed dielectric region. For example, the first surface finish region 1202 may be applied to a surface 1204 of the further dielectric region 1102, as illustrated. One or more openings may be formed in the first surface finish region 1202. The openings may expose one or more of the pads formed on the exposed dielectric region, such as first pad 1206 and second pad 1208.

Figure 5:
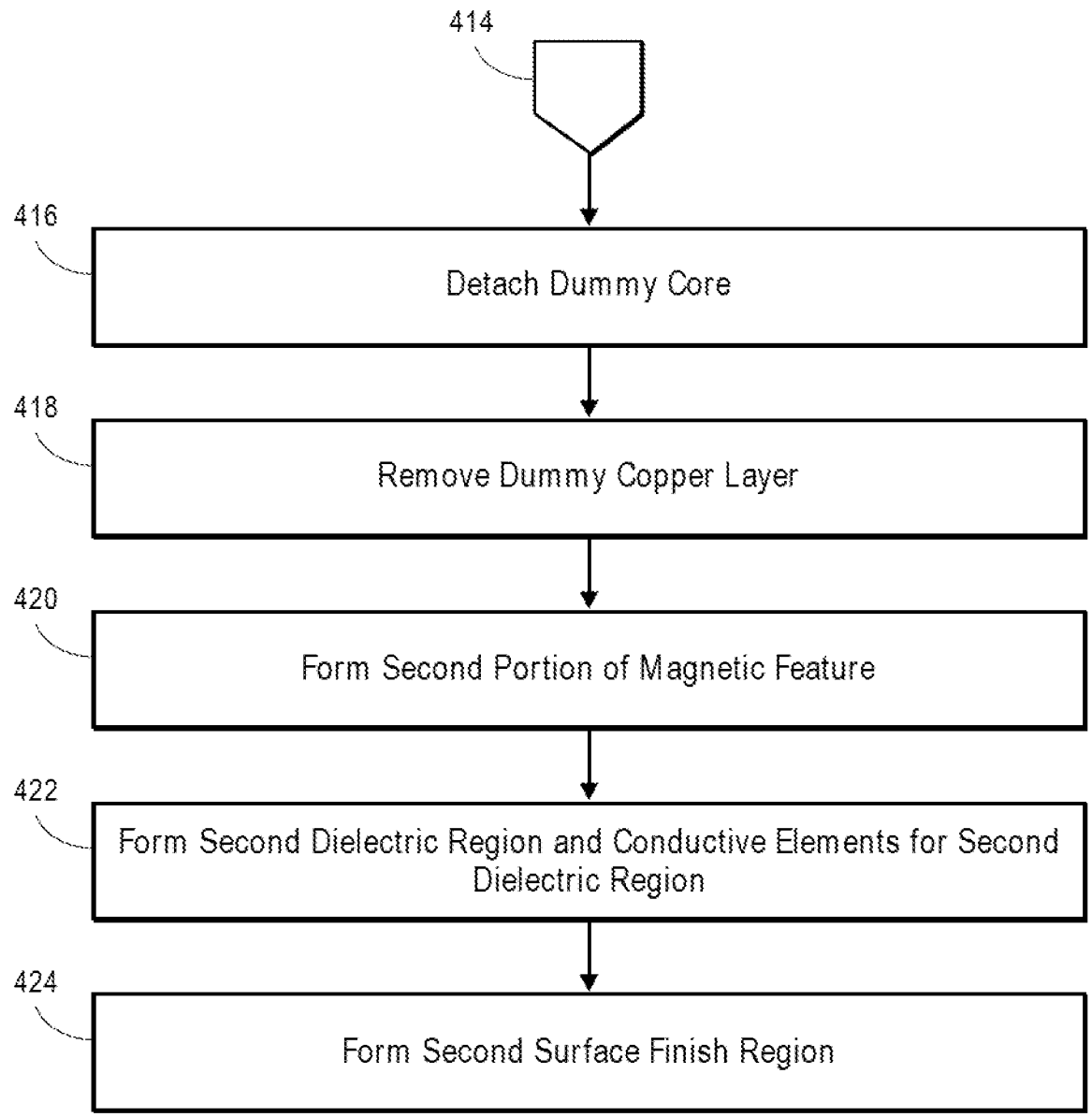
FIG. 5 illustrates a second portion of the example procedure, according to various embodiments.

Reference object 414 indicates that the procedure 400 continues in FIG. 5. In particular, FIG. 5 illustrates a second portion of the example procedure 400, according to various embodiments.

Figure 13:
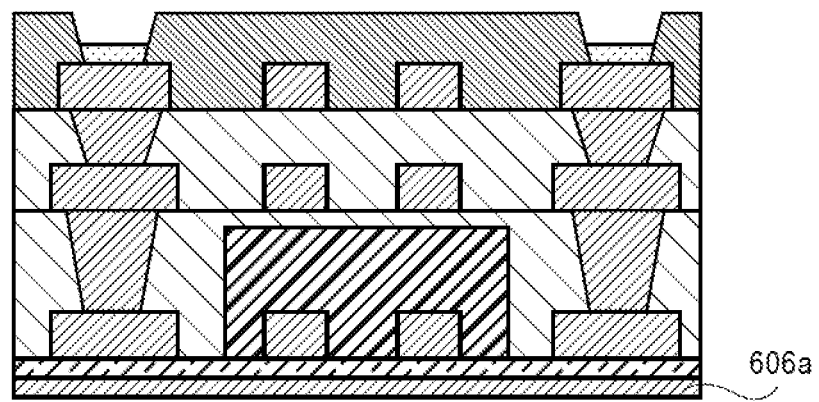
FIG. 13 illustrates a cross-sectional view of an example resultant base substrate in accordance with stage 416, according to various embodiments.

In stage 416, the dummy core 602 (FIG. 6) may be removed. FIG. 13 illustrates a cross-sectional view of an example resultant base substrate in accordance with stage 416, according to various embodiments. For example, the first sacrificial layer 604a (FIG. 6) may be removed, thereby separating the dummy core 602. The first sacrificial layer 604a may be removed through application of heat, application of a chemical, or some combination thereof. Accordingly, the first dummy copper layer 606a may be exposed.

Figure 14:
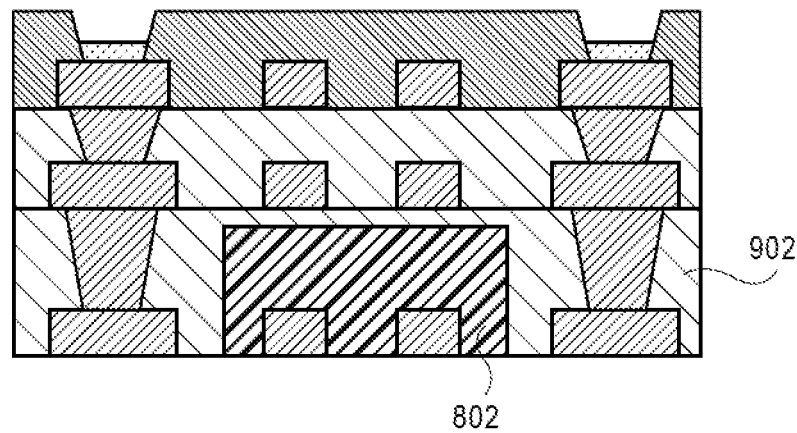
FIG. 14 illustrates a cross-sectional view of an example resultant base substrate in accordance with stage 418, according to various embodiments.

In stage 418, the first dummy copper layer 606a (FIG. 6) may be removed. Further, the nickel plating 702 (FIG. 7) may be removed. FIG. 14 illustrates a cross-sectional view of an example resultant base substrate in accordance with stage 418, according to various embodiments. Removing the dummy copper layer 606a may include applying a copper etching process to remove the dummy copper layer 606a. Removing the nickel plating 702 may include applying a nickel etching process to remove the nickel plating 702. Accordingly, the first dielectric region 902 and the first portion 802 of the magnetic feature may be exposed.

Figure 15:
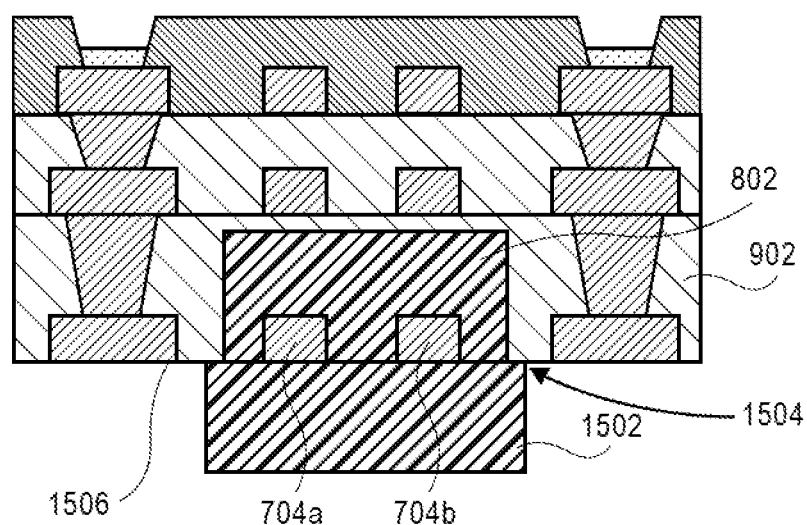
FIG. 15 illustrates a cross-sectional view of an example resultant base substrate in accordance with stage 420, according to various embodiments.

In stage 420, a second portion 1502 of the magnetic feature 1504 may be formed. FIG. 15 illustrates a cross-sectional view of an example resultant base substrate in accordance with stage 420, according to various embodiments. In particular, the first portion 802 and the second portion 1502 of the magnetic feature 1504 may form the magnetic feature 1504. The second portion 1502 may be applied to a surface 1506 formed by the first dielectric region 902 and the first portion 802 of the magnetic feature 1504. Applying the second portion 1502 may include applying magnetic paste to the surface 1506 and curing the magnetic paste, such as through the application of heat, chemicals, or some combination thereof to the second portion 1502 of the magnetic feature 1504. The first portion 802 and the second portion 1502 of the magnetic feature 1504 may encircle a portion of the first conductive element 704a and the second conductive element 704b.

Figure 16:
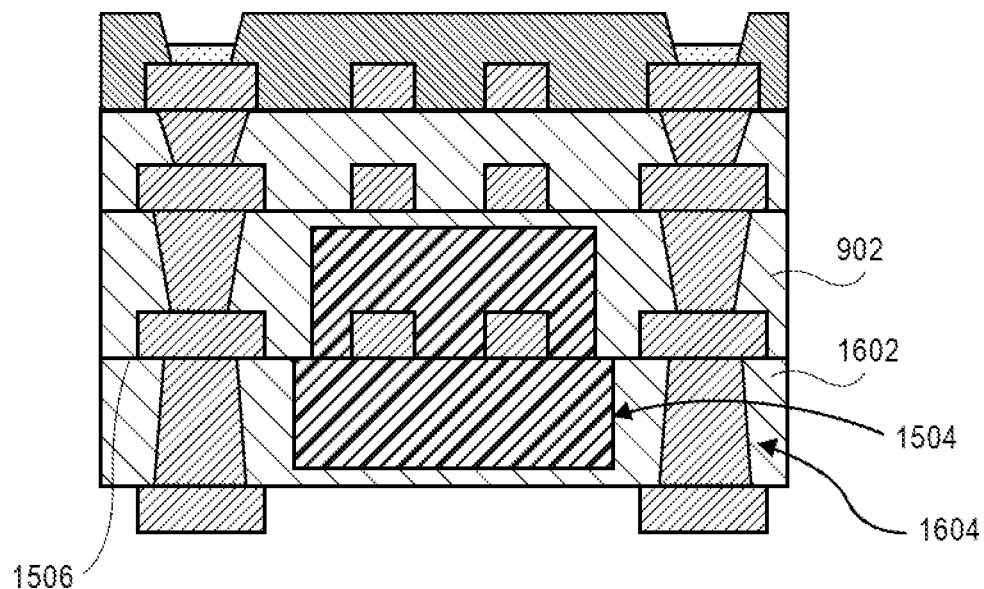
FIG. 16 illustrates a cross-sectional view of an example resultant base substrate in accordance with stage 422, according to various embodiments.

In stage 422, a second dielectric region 1602 and conductive elements 1604 for the second dielectric region 1602 may be formed. FIG. 16 illustrates a cross-sectional view of an example resultant base substrate in accordance with stage 422, according to various embodiments. The second dielectric region 1602 may comprise a second dielectric layer. The second dielectric region 1602 may be formed by applying one or more build up films to the surface 1506. The first dielectric region 902 and the second dielectric region 1602 may encompass the magnetic feature 1504. The conductive elements 1604 may be formed by the same process for forming the conductive elements 1002 (FIG. 10) described in relation to stage 408, with the process being applied to the second dielectric region 1602.

Figure 17:
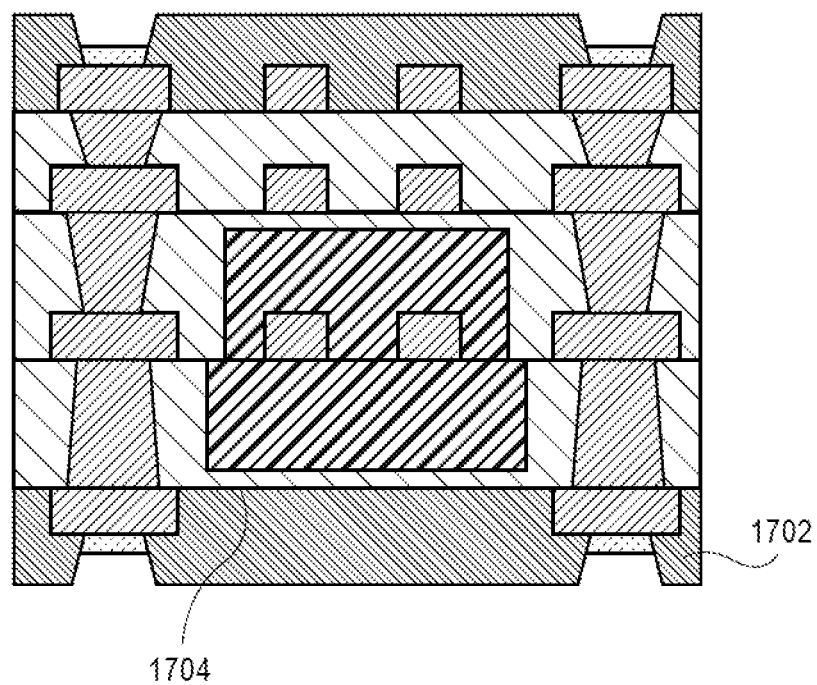
FIG. 17 illustrates a cross-sectional view of an example resultant base substrate in accordance with stage 424, according to various embodiments.

In stage 424, a second surface finish region 1702 may be formed. FIG. 17 illustrates a cross-sectional view of an example resultant base substrate in accordance with stage 424, according to various embodiments. The second surface finish region 1702 may be formed on a surface 1704. The second surface finish region 1702 may be formed by the same process for forming the first surface finish region 1202 (FIG. 12) described in relation to stage 412.

Figure 18:
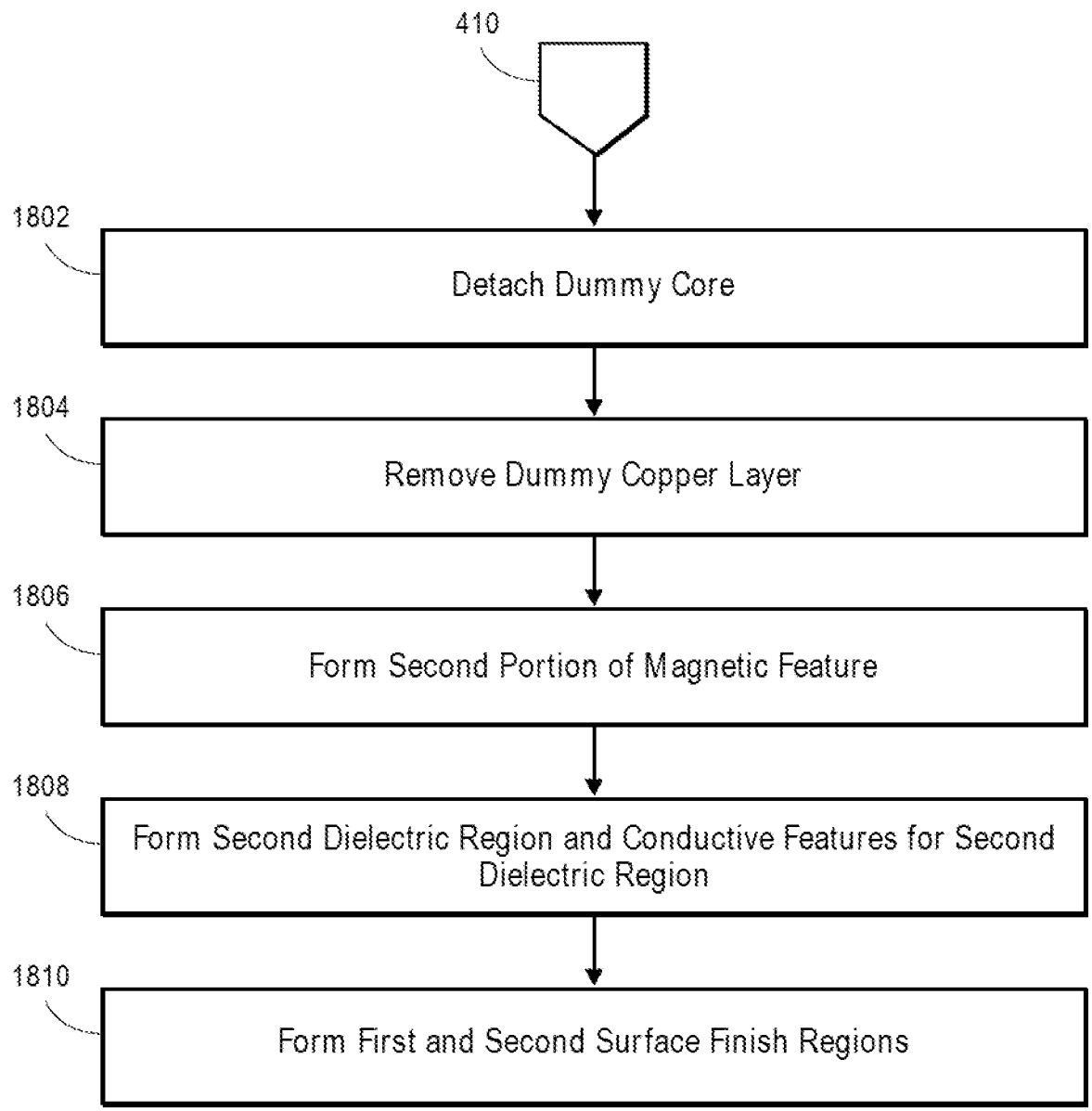
FIG. 18 illustrates a portion of another example procedure of producing a substrate assembly with a magnetic feature, according to various embodiments.

FIG. 18 illustrates a portion of another example procedure 1800 of producing a substrate assembly with a magnetic feature, according to various embodiments. For example, the procedure 1800 may be utilized to produce the substrate assembly 100 (FIG. 1). The portion of the procedure 1800 illustrated may proceed from stage 410 (FIG. 4) of the procedure 400 (FIG. 4). In particular, procedure 1800 may include stages 402, 404, 406, 408, and 410 (FIG. 4), where the procedure 1800 proceeds from stage 410 illustrated in FIG. 4 to stage 1802 illustrated in FIG. 18.

Figure 19:
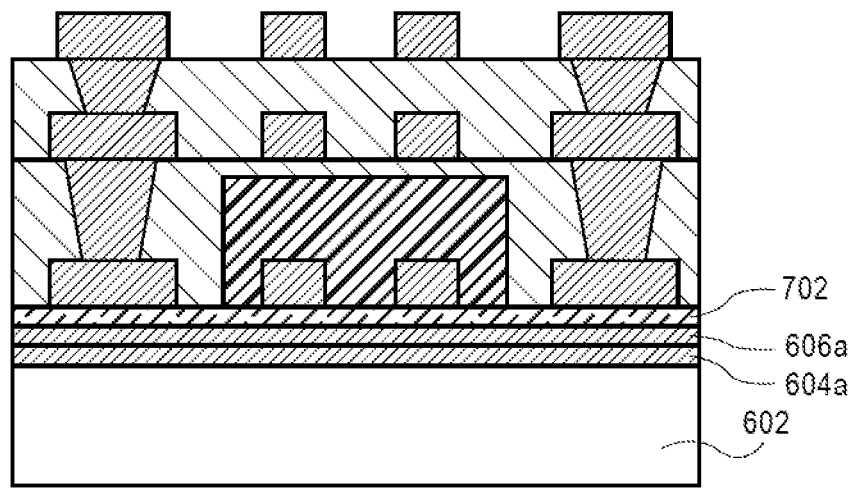
FIG. 19 illustrates a cross-sectional view of an example resultant base substrate in accordance with stage 410, according to various embodiments.

Reference object 410 is illustrated in FIG. 18 to show that procedure 1800 proceeds from stage 410 to stage 1802. FIG. 19 illustrates a cross-sectional view of an example resultant base substrate in accordance with stage 410, according to various embodiments. Stage 1802 may be applied to the resultant base substrate illustrated in FIG. 19.

Figure 20:
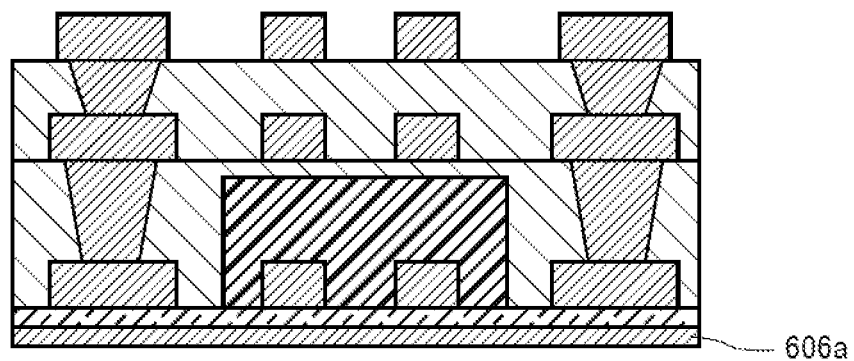
FIG. 20 illustrates a cross-sectional view of an example resultant base substrate in accordance with stage 1802, according to various embodiments.

In stage 1802, the dummy core 602 (FIG. 19) may be removed. FIG. 20 illustrates a cross-sectional view of an example resultant base substrate in accordance with stage 1802, according to various embodiments. The dummy core 602 may be removed by the same process for removing the dummy core 602 described in relation to stage 416 (FIG. 5). The first dummy copper layer 606a may be exposed after removal of the dummy core 602

Figure 21:
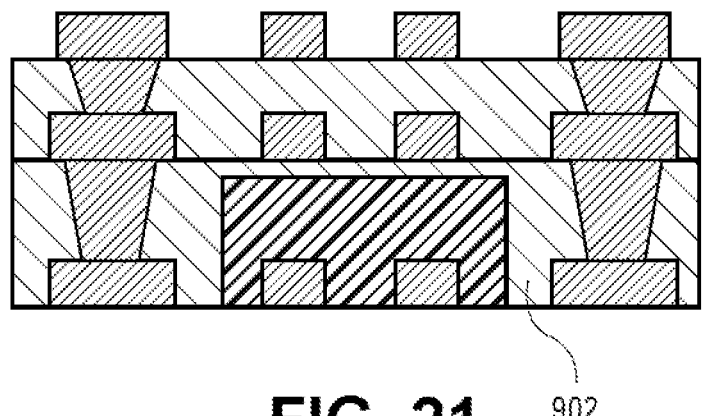
FIG. 21 illustrates a cross-sectional view of an example resultant base substrate in accordance with stage 1804, according to various embodiments.

In stage 1804, the first dummy copper layer 606a (FIG. 19) may be removed. Further, the nickel plating 702 (FIG. 19) may be removed. FIG. 21 illustrates a cross-sectional view of an example resultant base substrate in accordance with stage 1804, according to various embodiments. The first dummy copper layer 606a and the nickel plating 702 may be removed by the same process for removing the first dummy copper layer 606a and the nickel plating layer 702 described in relation to stage 418 (FIG. 5).

Figure 22:
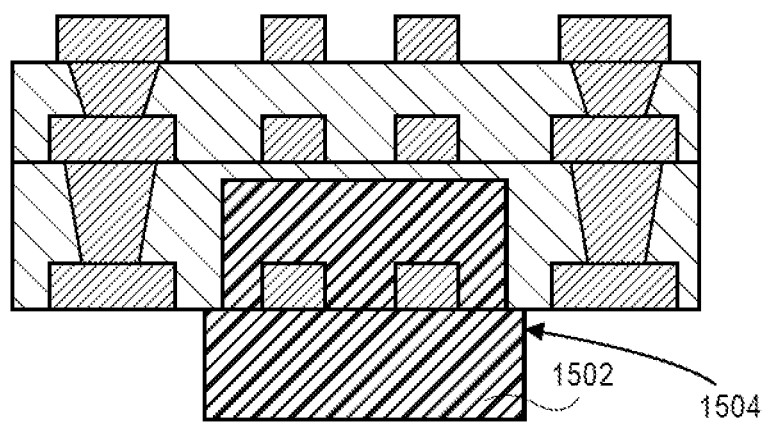
FIG. 22 illustrates a cross-sectional view of an example resultant base substrate in accordance with stage 1806, according to various embodiments.

In stage 1806, the second portion 1502 of the magnetic feature 1504 may be formed. FIG. 22 illustrates a cross-sectional view of an example resultant base substrate in accordance with stage 1806, according to various embodiments. The second portion 1502 of the magnetic feature 1504 may be formed by the same process for forming the second portion 1502 described in relation to stage 420 (FIG. 4).

Figure 23:
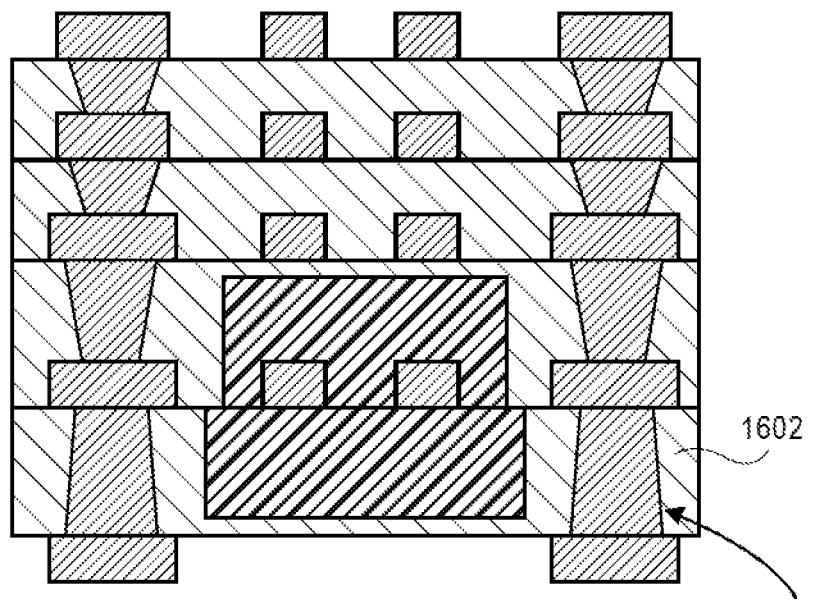
FIG. 23 illustrates a cross-sectional view of an example resultant base substrate in accordance with stage 1808, according to various embodiments.

In stage 1808, the second dielectric region 1602 and the conductive elements 1604 for the second dielectric region 1602 may be formed. FIG. 23 illustrates a cross-sectional view of an example resultant base substrate in accordance with stage 1808, according to various embodiments. The second dielectric region 1602 and the conductive elements 1604 may be formed by the same process for forming the second dielectric region 1602 and the conductive elements 1604 described in relation to stage 422 (FIG. 5).

Figure 24:
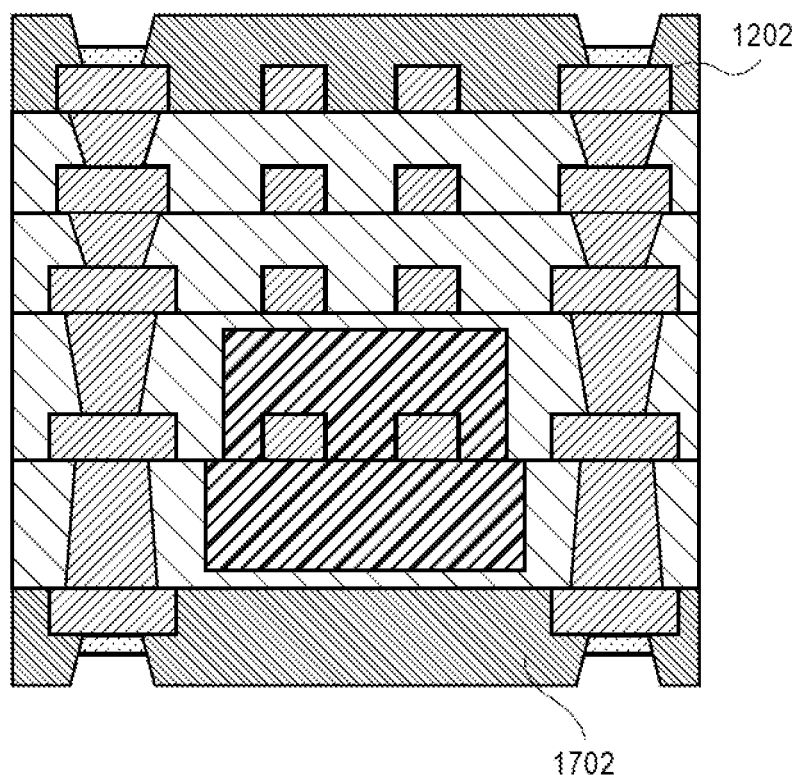
FIG. 24 illustrates a cross-sectional view of an example resultant base substrate in accordance with stage 1810, according to various embodiments.

In stage 1810, the first surface finish region 1202 and the second surface finish region 1702 may be formed. FIG. 24 illustrates a cross-sectional view of an example resultant base substrate in accordance with stage 1810, according to various embodiments. The first surface finish region 1202 may be formed by the same process of forming the first surface finish region 1202 described in relation to stage 412 (FIG. 4). Further, the second surface finish region 1702 may be formed by the same process of forming the second surface finish region 1702 described in relation to stage 424 (FIG. 4).

FIG. 25 illustrates an example computer device 2500 that may employ the apparatuses and/or methods described herein (e.g., the substrate assembly 100, and/or the portion 300 of the computer device), in accordance with various embodiments. As shown, computer device 2500 may include a number of components, such as one or more processor(s) 2504 (one shown) and at least one communication chip 2506. In various embodiments, the one or more processor(s) 2504 each may include one or more processor cores. In various embodiments, the at least one communication chip 2506 may be physically and electrically coupled to the one or more processor(s) 2504. In further implementations, the communication chip 2506 may be part of the one or more processor(s) 2504. In various embodiments, computer device 2500 may include printed circuit board (PCB) 2502. For these embodiments, the one or more processor(s) 2504 and communication chip 2506 may be disposed thereon. In alternate embodiments, the various components may be coupled without the employment of PCB 2502.

Depending on its applications, computer device 2500 may include other components that may or may not be physically and electrically coupled to the PCB 2502. These other components include, but are not limited to, memory controller 2526, volatile memory (e.g., dynamic random access memory (DRAM) 2520), non-volatile memory such as read only memory (ROM) 2524, flash memory 2522, storage device 2554 (e.g., a hard-disk drive (HDD)), an I/O controller 2541, a digital signal processor (not shown), a crypto processor (not shown), a graphics processor 2530, one or more antenna 2528, a display (not shown), a touch screen display 2532, a touch screen controller 2546, a battery 2536, an audio codec (not shown), a video codec (not shown), a global positioning system (GPS) device 2540, a compass 2542, an accelerometer (not shown), a gyroscope (not shown), a speaker 2550, a camera 2552, and a mass storage device (such as hard disk drive, a solid state drive, compact disk (CD), digital versatile disk (DVD)) (not shown), and so forth.

In some embodiments, the one or more processor(s) 2504, flash memory 2522, and/or storage device 2554 may include associated firmware (not shown) storing programming instructions configured to enable computer device 2500, in response to execution of the programming instructions by one or more processor(s) 2504, to practice all or selected aspects of the methods described herein. In various embodiments, these aspects may additionally or alternatively be implemented using hardware separate from the one or more processor(s) 2504, flash memory 2522, or storage device 2554.

In various embodiments, one or more components of the computer device 2500 may be coupled to the PCB 2502 via the substrate assembly 100 (FIG. 1). For example, the arrangement of the each component with the substrate assembly 100 may be the same arrangement as the portion 300 (FIG. 3) of the computer device, where the first electrical component 302a (FIG. 3) may be the PCB 2502 and the second electrical component 302b (FIG. 3) may be the component. In particular, the processor 2504 may be coupled to the PCB 2502 via the substrate assembly 100 in some embodiments.

The communication chips 2506 may enable wired and/or wireless communications for the transfer of data to and from the computer device 2500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2506 may implement any of a number of wireless standards or protocols, including but not limited to IEEE 802.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computer device 2500 may include a plurality of communication chips 2506. For instance, a first communication chip 2506 may be dedicated to shorter range wireless communications such as Wi-Fi and Bluetooth, and a second communication chip 2506 may be dedicated to longer range wireless communications such as GPS, EDGE, GPRS, CDMA, WiMAX, LTE, Ev-DO, and others.

In various implementations, the computer device 2500 may be a laptop, a netbook, a notebook, an ultrabook, a smartphone, a computer tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computer device 2500 may be any other electronic device that processes data.

Example 1 may include a substrate assembly, comprising a base substrate, a magnetic feature encapsulated within the base substrate, and a coil, wherein a portion of the coil extends through the magnetic feature.

Example 2 may include the substrate assembly of example 1, wherein the magnetic feature is encapsulated by a dielectric material of the base substrate.

Example 3 may include the substrate assembly of example 1, wherein the portion of the coil that extends through the magnetic feature comprises one or more traces.

Example 4 may include the substrate assembly of example 3, wherein the one or more traces extend from a first side of the magnetic feature to a second side of the magnetic feature, the second side being opposite from the first side.

Example 5 may include the substrate assembly of example 4, wherein the coil includes one or more vias coupled to the one or more traces, and wherein the one or more vias extend through a dielectric material of the base substrate.

Example 6 may include the substrate assembly of any of examples 1-4, wherein the magnetic feature encircles the portion of the coil.

Example 7 may include the substrate assembly of any of examples 1-4, wherein the base substrate includes a first surface finish region located at a first side of the base substrate and a second surface finish region located at a second side of the base substrate, wherein the second side of the base substrate is opposite to the first side of the base substrate, and wherein the magnetic feature is located between the first surface finish region and the second surface finish region.

Example 8 may include the substrate assembly of any of examples 1-4, wherein the magnetic feature includes a ferromagnetic material.

Example 9 may include the substrate assembly of any of examples 1-4, wherein the base substrate includes a first conductive path located toward a first side of the base substrate and a second conductive path located toward a second side of the base substrate, the first side of the base substrate being opposite to the second side of the base substrate, and wherein the magnetic feature is located between the first conductive path and the second conductive path.

Example 10 may include a computer device, comprising a printed circuit board (PCB), a substrate assembly coupled to the PCB, wherein the substrate assembly includes a base substrate, a magnetic feature encapsulated within the base substrate, and a coil, wherein a portion of the coil extends through the magnetic feature, and a semiconductor chip coupled to the substrate assembly, wherein a portion of the semiconductor chip is electrically coupled to the coil.

Example 11 may include the computer device of example 10, wherein the magnetic feature is encapsulated by a dielectric material of the base substrate.

Example 12 may include the computer device of example 11, wherein the portion of the coil includes one or more traces, and wherein the one or more traces extend into the dielectric material.

Example 13 may include the computer device of example 12, wherein the coil includes one or more vias coupled to the one or more traces, and wherein the one or more vias extend through the dielectric material of the base substrate.

Example 14 may include the computer device of any of examples 10-13, wherein the magnetic feature includes a ferromagnetic material.

Example 15 may include the computer device of any of examples 10-13, wherein the base substrate includes a first dielectric region and a first surface finish region located between a first side of the base substrate and the magnetic feature, and wherein the base substrate includes a second dielectric region and a second surface finish region located between a second side of the base substrate and the magnetic feature, wherein the first side of the base substrate is opposite to the second side of the base substrate.

Example 16 may include the computer device of example 15, wherein the base substrate further includes a third dielectric region located between the first dielectric region and the first surface finish region.

Example 17 may include a method of forming a substrate assembly, comprising forming one or more traces on a dummy copper region that is coupled to a dummy core, forming a first portion of a magnetic feature on the dummy copper region, wherein a portion of the one or more traces is encircled between the first portion of the magnetic feature and the dummy copper region, forming a first dielectric region on the dummy copper region, wherein the first portion of the magnetic feature is encapsulated between the first dielectric region and the dummy copper region, removing the dummy copper region and the dummy core, forming a second portion of the magnetic feature on an opposite side of the one or more traces from which the first portion of the magnetic feature is located, wherein the portion of the one or more traces is encircled between the first portion of the magnetic feature and the second portion of the magnetic feature, and forming a second dielectric region on the second portion of the magnetic feature, wherein the magnetic feature is encapsulated between the first dielectric region and the second dielectric region.

Example 18 may include the method of example 17, wherein the one or more traces are one or more first traces, and wherein the method further comprises forming one or more vias in the first dielectric region, the one or more vias coupled to the one or more first traces, and forming one or more second traces on the first dielectric region, the one or more second traces coupled to the one or more vias, wherein the one or more first traces, the one or more vias, and the one or more second traces form a coil.

Example 19 may include the method of any examples 17 or 18, wherein forming the first portion of the magnetic feature includes applying first magnetic paste on the dummy copper region, and curing the first magnetic paste to form the first portion of the magnetic feature, and forming the second portion of the magnetic feature includes, applying second magnetic paste on the opposite side of the one or more traces, and curing the second magnetic paste to form the second portion of the magnetic feature.

Example 20 may include the method of any examples 17 or 18, further comprising forming a third dielectric region on the first dielectric region, the third dielectric region on an opposite side of the first dielectric region from the first portion of the magnetic feature, forming a first surface finish region on the third dielectric region, the first surface finish region on an opposite side of the third dielectric region from the first dielectric region, and forming a second surface finish region on the second dielectric region, the second surface finish region on an opposite side of the second dielectric region from the second portion of the magnetic feature.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. A method of forming a substrate assembly, comprising:
    forming one or more traces on a dummy copper region that is coupled to a dummy core;
    forming a first portion of a magnetic feature on the dummy copper region, wherein a portion of the one or more traces is encircled between the first portion of the magnetic feature and the dummy copper region;
    forming a first dielectric region on the dummy copper region, wherein the first portion of the magnetic feature is encapsulated between the first dielectric region and the dummy copper region;
    removing the dummy copper region and the dummy core;
    forming a second portion of the magnetic feature on an opposite side of the one or more traces from which the first portion of the magnetic feature is located, wherein the portion of the one or more traces is encircled between the first portion of the magnetic feature and the second portion of the magnetic feature; and
    forming a second dielectric region on the second portion of the magnetic feature, wherein the magnetic feature is encapsulated between the first dielectric region and the second dielectric region.

2. The method of claim 1, wherein the one or more traces are one or more first traces, and wherein the method further comprises:
    forming one or more vias in the first dielectric region, the one or more vias coupled to the one or more first traces; and
    forming one or more second traces on the first dielectric region, the one or more second traces coupled to the one or more vias, wherein the one or more first traces, the one or more vias, and the one or more second traces form a coil.

3. The method of claim 1, wherein:
    forming the first portion of the magnetic feature includes:
        applying first magnetic paste on the dummy copper region; and
        curing the first magnetic paste to form the first portion of the magnetic feature; and
    forming the second portion of the magnetic feature includes:
        applying second magnetic paste on the opposite side of the one or more traces; and
        curing the second magnetic paste to form the second portion of the magnetic feature.

4. The method of claim 1, further comprising:
    forming a third dielectric region on the first dielectric region, the third dielectric region on an opposite side of the first dielectric region from the first portion of the magnetic feature;
    forming a first surface finish region on the third dielectric region, the first surface finish region on an opposite side of the third dielectric region from the first dielectric region; and forming a second surface finish region on the second dielectric region, the second surface finish region on an opposite side of the second dielectric region from the second portion of the magnetic feature.

5. A method of fabricating a substrate assembly, the method comprising:
    forming a base substrate;
    forming a magnetic feature encapsulated within the base substrate, the magnetic feature having a top surface opposite a bottom surface, and side surfaces between the top surface and the bottom surface; and
    forming a coil, wherein a portion of the coil extends through one or more of the side surfaces of the magnetic feature.

6. The method of claim 5, wherein the magnetic feature is encapsulated by a dielectric material of the base substrate.

7. The method of claim 5, wherein the portion of the coil that extends through the magnetic feature comprises one or more traces.

8. The method of claim 7, wherein the one or more traces extend from a first side of the magnetic feature to a second side of the magnetic feature, the second side being opposite from the first side.

9. The method of claim 8, wherein the coil includes one or more vias coupled to the one or more traces, and wherein the one or more vias extend through a dielectric material of the base substrate.

10. The method of claim 5, wherein the magnetic feature encircles the portion of the coil.

11. The method of claim 5, wherein the base substrate includes a first surface finish region located at a first side of the base substrate and a second surface finish region located at a second side of the base substrate, wherein the second side of the base substrate is opposite to the first side of the base substrate, and wherein the magnetic feature is located between the first surface finish region and the second surface finish region.

12. The method of claim 5, wherein the magnetic feature includes a ferromagnetic material.

13. The method of claim 5, wherein the base substrate includes a first conductive path located toward a first side of the base substrate and a second conductive path located toward a second side of the base substrate, the first side of the base substrate being opposite to the second side of the base substrate, and wherein the magnetic feature is located between the first conductive path and the second conductive path.

14. A method of fabricating a computer device, the method comprising:
  providing a printed circuit board (PCB);
  coupling a substrate assembly to the PCB, wherein the substrate assembly includes:
    a base substrate;
    a magnetic feature encapsulated within the base substrate, the magnetic feature having a top surface opposite a bottom surface, and side surfaces between the top surface and the bottom surface; and
    a coil, wherein a portion of the coil extends through one or more of the side surfaces of the magnetic feature; and
  a semiconductor chip coupled to the substrate assembly, wherein a portion of the semiconductor chip is electrically coupled to the coil.

15. The method of claim 14, wherein the magnetic feature is encapsulated by a dielectric material of the base substrate.

16. The method of claim 15, wherein the portion of the coil includes one or more traces, and wherein the one or more traces extend into the dielectric material.

17. The method of claim 16, wherein the coil includes one or more vias coupled to the one or more traces, and wherein the one or more vias extend through the dielectric material of the base substrate.

18. The method of claim 14, wherein the magnetic feature includes a ferromagnetic material.

19. The method of claim 14, wherein the base substrate includes a first dielectric region and a first surface finish region located between a first side of the base substrate and the magnetic feature, and wherein the base substrate includes a second dielectric region and a second surface finish region located between a second side of the base substrate and the magnetic feature, wherein the first side of the base substrate is opposite to the second side of the base substrate.

20. The method of claim 19, wherein the base substrate further includes a third dielectric region located between the first dielectric region and the first surface finish region.

\* \* \* \* \*